United States Patent [19]
Isaac

[11] Patent Number: 5,414,371
[45] Date of Patent: May 9, 1995

[54] SEMICONDUCTOR DEVICE TEST PROBE RING APPARATUS AND METHOD OF MANUFACTURE

[75] Inventor: George L. Isaac, Santa Clara, Calif.

[73] Assignee: Probes Associates, Inc., Santa Clara, Calif.

[21] Appl. No.: 37,012

[22] Filed: Mar. 25, 1993

[51] Int. Cl.$^6$ .............................................. G01R 1/073
[52] U.S. Cl. ...................................................... 324/762
[58] Field of Search ................ 324/158 P, 158 F, 754, 324/762

[56] References Cited

U.S. PATENT DOCUMENTS

| 4,574,235 | 3/1986 | Kelly et al. | 324/158 F |
| 5,061,894 | 10/1991 | Ikeda | 324/158 P |
| 5,221,895 | 6/1993 | Janko et al. | 324/158 F |

OTHER PUBLICATIONS

Contacting A Multitude of Miniscule Nodes, Gerald Jacob, Evaluation Engineering, Aug. 1991.
The Dual Challenges of Wafer Probing, Peter H. Singer, Semiconductor International, Dec. 1989.
The Probe Card Dilemma, Betty Newboe, Semiconductor International, Sep. 1992.

*Primary Examiner*—Ernest F. Karlsen
*Attorney, Agent, or Firm*—H. M. Stanley

[57] ABSTRACT

A test probe ring for semiconductor devices is disclosed which contains a ground plane layer, an insulating layer and a layer of electrically separate conductors. A centrally located opening in the layered assembly has a plurality of layered fingers carrying the inner ends of the conductors. A pattern of contact bumps on the free ends of the fingers provides a co-planar pattern of conductor contacts which match a pattern of semiconductor device test pads. The fingers and contacts are formed by cutting kerfs between the conductors at the periphery of the centrally located opening.

17 Claims, 2 Drawing Sheets

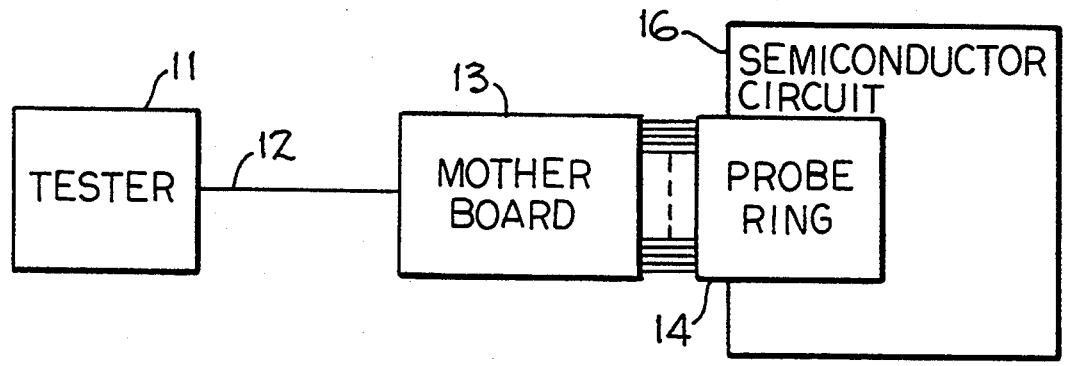
_fig_1
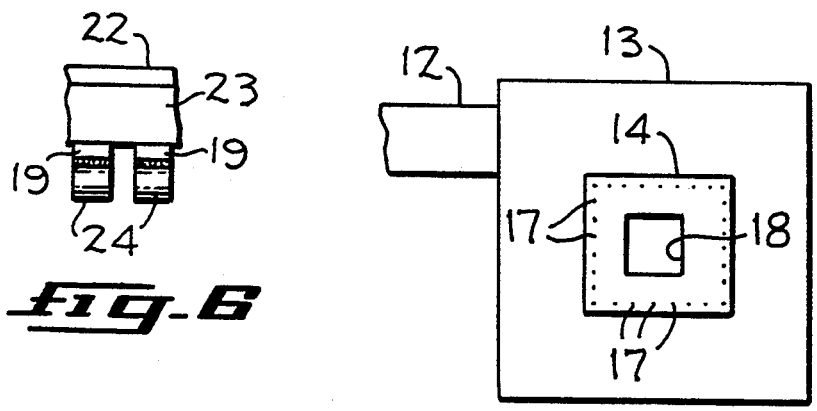
_fig_6
_fig_2
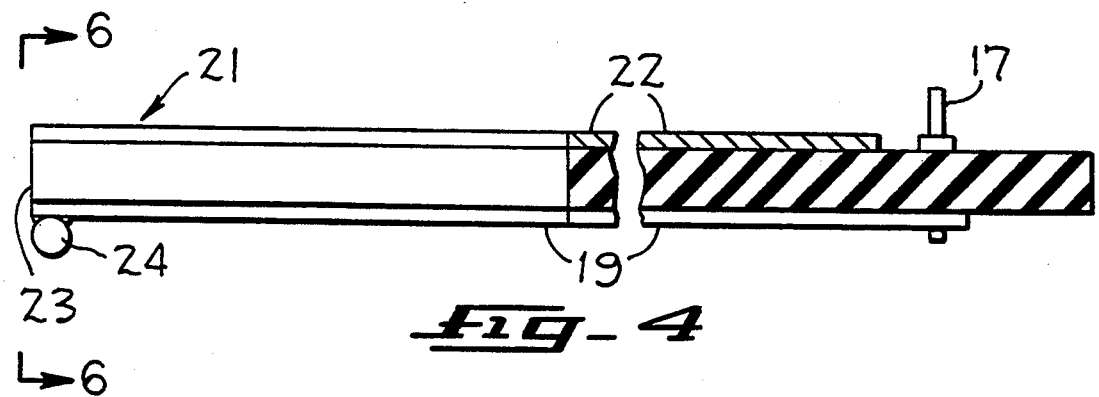
_fig_4

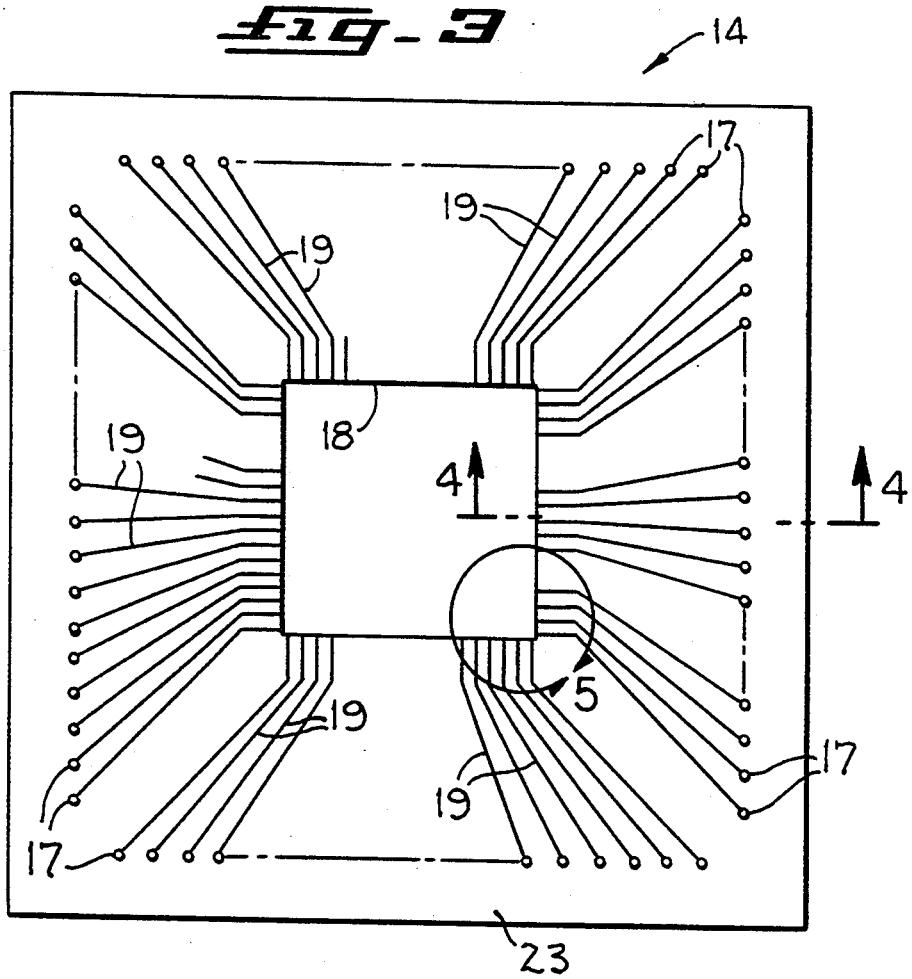
Fig_3
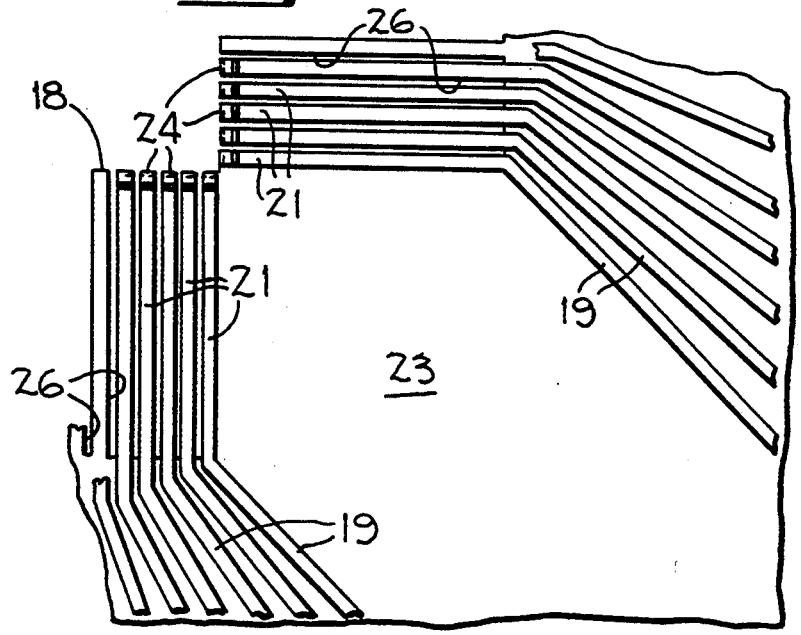
Fig_5

SEMICONDUCTOR DEVICE TEST PROBE RING APPARATUS AND METHOD OF MANUFACTURE

SUMMARY OF THE INVENTION

A semiconductor test probe ring is disclosed herein for use in contacting a test pattern on a semiconductor device to be tested. An insulation layer having a predetermined thickness and enclosing an opening therein is attached to a plurality of electrically separate conductors on a contact side of the probe ring wherein the conductors each have inner and outer ends. An electrically conductive ground plane member is attached to the insulation layer on the side opposite from the contact side for providing support for the insulation layer and the plurality of conductors. The ground plane has an opening which is aligned with the insulation layer opening. A plurality of layered fingers have free ends which extend to the edge of the aligned openings. The fingers have ground plane, insulation and conductor layers attached to the ground plane, insulation layer and the inner ends of separate ones of the conductors respectively. Connector means is provided for terminating the outer ends of the conductors and a cylindrical contact having a cylindrical peripheral surface and a cylindrical axis is formed on the free end of each of the plurality of conductors. The cylindrical contacts are attached to the free ends of the plurality of conductors along a portion of the cylindrical peripheral surface which is parallel to the cylindrical axis and thus form a substantially coplanar contact pattern which is in registration with the test pattern, whereby the plurality of conductors have substantially uniform and predetermined impedance at high test signal frequency.

A test probe ring for semiconductor devices having a predetermined pattern of test pads connected thereto includes a first layer of structural support material on a support side of the test probe ring, wherein the first layer provides an electrical ground plane. A second layer of insulating material is attached to the first layer and a third layer of electrically separate conductors is attached to the second layer on a contact side of the test probe ring. First, second and third layers have central aligned openings therethrough. A plurality of layered fingers extends to the edge of the aligned openings, each finger having ground plane, insulation and separate conductor layers connected to the first, second and third layers respectively. A cylindrical contact having a cylindrical peripheral surface and a cylindrical axis is attached to the free end of each of the finger conductors along a portion of the cylindrical surface parallel to the cylindrical axis to form a pattern of contacts substantially in registration with the predetermined pattern of test pads. The second and third layer thicknesses provide a predetermined separate conductor impedance at high frequency in view of interconductor capacitance, inductance and resistance.

BRIEF DESCRIPTION OF THE DRAWINGS

FIG. 1 is a schematic of a drawing of a system for testing the semiconductor devices within which the present invention is used.

FIG. 2 depicts the probe ring of the present invention on a mother board.

FIG. 3 is a plan view of a test probe ring incorporating the present invention.

FIG. 4 is a section view taken along the line 4—4 of FIG. 3.

FIG. 5 is a detail view seen at 5 in FIG. 3.

FIG. 6 is a view taken along the line 6—6 of FIG. 4.

DESCRIPTION OF THE PREFERRED EMBODIMENT

Test probe cards, sometimes called test probe rings, are essential for checking the operability of integrated circuits fabricated on semiconductor wafers. It is essential to ascertain whether the integrated circuits are in existence as designed on the wafer to assure early detection of integrated circuit formation process flaws and to avoid packaging inoperative integrated circuits, because the packaging process is expensive. Integrated circuits have as a part thereof a predetermined pattern of test pads to receive test signals from an integrated circuit tester to ascertain appropriate design response of the integrated circuit. This array of test pads on the integrated circuit requires very accurate mechanical positioning of a test probe card so that the test signals are transmitted to the appropriate test pads. Further, the appropriate test signals must be sent to and received from the integrated circuit through cables, probe test card contacts and probe test card conductors with a minimal loss in signal fidelity. With integrated circuit test pads numbering 600 or more and circuit operating frequencies up to 90 gegahertz (GHz), mechanical positioning and electrical test signal preservation problems loom as serious challenges.

FIG. 1 of the drawings shows a piece of integrated circuit test equipment 11. Such testers are made by companies such as Scientific Test Inc. of Garland, Tex. A cable 12 extends from the tester to a mother board 13. The mother board has assembled thereon, a test probe ring 14 for contacting a test pad pattern on a semiconductor integrated circuit 16. The aforementioned mechanical and electrical test signal transmission problems reside in the system depicted in FIG. 1 and are, for the most part, existent in the test probe ring 14.

FIG. 2 shows the cable 12 leading to the mother board 13 and having the test probe ring 14 mounted thereon. It should be noted that the test probe ring has a number of terminals 17 around the periphery of the card for making connections between the mother board and the test probe ring. Terminals 17 could exist in the form of a connector between the mother board and the test probe ring or in the form of other means for effecting electrical communication between the mother board and the test probe. The assembly of the mother board and the test probe ring is called a probe card. It should be noted that in the center of the test probe ring 14 there exists an opening 18.

Turning to FIG. 3, a larger scale depiction of the test probe ring 14 is shown. It should be understood that the integrated circuit test pad pattern may take any shape according to the integrated circuit designer. However, such designers tend to make the test pad pattern as simple and as standard as possible to facilitate integrated circuit testing. FIG. 3 shows the test probe ring 14 having the substantially square opening 18 centrally located thereon. FIG. 3 shows the contact side of the test probe ring having test signal conductors 19 extending radially on the contact side of the test probe ring. In this embodiment 150 of such conductors 19 are shown in one set extending between the terminals 17 on one side of the probe ring and one side of the opening 18 in the probe ring, wherein each of the four sets of 150 conductors fans out through 90 degrees on the contact side of the test ring. Each of the conductors 19 is terminated in a finger 21 having a free end extending to the edge of the opening 18, such fingers to be hereinafter described.

The test probe ring 14 is of laminated construction. FIG. 4 shows a section through the test probe ring from the opening 18 through the outer dimension of the ring wherein the aforementioned finger 21 extends to the edge of the opening 18. The test probe ring laminated construction consists of a first structural layer 22 which may be of some relatively strong material such as stainless o steel. Bonded to the structural layer 22 is a second insulating layer 23 having a contact side upon which is attached the array of conductors 19 as described in FIG. 3. As previously described, each of the conductors 19 is electrically separated and terminated at an outer conductor end at a terminal 17 at the outer edge of the test probe ring 14. Each of the fingers 21 has a free end at the periphery of the opening 18. Each of the conductors 19 extends out along one of the fingers 21 having a contact bump 24 fixed in electrical contact with the conductor 19. It may therefore be seen that each of the conductors 19 in this embodiment extends from the contact bump 24 at the end of the conductor on the free end of the finger 21 to a terminal 17 located at the outer end of the conductor near the outer periphery of the test probe 14.

The stainless steel layer 22 provides strength to the test probe ring and also provides a spring force to each finger 21 which resists upward movement of the contact bump 24. In this embodiment, with 150 conductors and fingers on each side of the opening 18 there are therefore 600 conductors 19 and 600 fingers 21 around the periphery of the opening 18. The spring force exerted by the stainless steel lamination 22 in the layered finger 21 maintains the contact bumps 24 in coplanar relationship in spite of numerous "hits" or contacts with integrated circuitry test pads for thousands of test contacts. The contact bump 24 is made of some substantially non-oxidizing material such as the alloy designated P7 which is also hard and durable. P7 is an alloy of gold, platinum, silver and palladium. Such a contact bump 24 also has low contact resistance with variations of under plus or minus 10%. The tendency toward non-oxidation of the contact bump 24, its constant low contact resistance characteristic and the spring force characteristic of the stainless steel lamination 22 in each of the fingers 21 provides for over one million test contacts, or "hits" in the disclosed embodiment.

The fingers 21 on the probe test card of the disclosed invention are extensions of the stainless steel lamination 22 and the dielectric lamination 23, each carrying a conductor trace 19 on the contact side thereof. The stainless steel layer 22 is typically three thousandths of an inch thick in the preferred embodiment. The dielectric layer 23 is Kapton material having a layer thickness of five thousandths of an inch in the preferred embodiment. The conductor trace 19 is a copper material having a thickness as seen in FIG. 4 of 1.4 thousandths of an inch. The copper conductors 19 may be fabricated on the contact side of the insulating layer 23 from a layer of copper conductor by means of photoetching or any other suitable process. As a result the conductor widths are about 2.5 thousandths of an inch wide, because the fingers are about 2.8 thousandths wide. The contact bump 24 is a circular cylindrical section of P7 wire which is soldered to the inner or free end of the conductor 17 or attached by any other means to be in electrically conductive contact with conductors 19. The P7 wire in the preferred embodiment was seven thousandths of an inch in diameter.

Turning to the detail of FIG. 5 of the drawings it may be seen that the fingers 21 extend to the peripheral of the opening 18. The contact bumps 24 are shown at the free end of each finger at the inner end of each of the conductors 19. The laminated test probe ring 14 is initially assembled in laminated condition as hereinbefore described with some connection means, such as terminal 17, at the outer end of each conductor. On the contact side of the test probe ring at the periphery of the opening 18 a length of P7 wire is attached in electrical contact with the inner ends of the conductors 19. At this point the P7 wire lies across all of the conductor ends on one quadrant of the test probe ring. A dicing saw, used to cut individual semiconductor circuits from a wafer containing many circuits, is used to cut slots 26 from the edge of the opening 18 in toward a point on the contact side of the test probe ring where the conductors 19 begin to fan out to their individual outer terminals. This cutting action forming the slots 26 not only cuts the stainless steel 22 and dielectric 23 layers, but also cuts through the P7 wire is length leaving a circular cylinder of P7 at the free end of each conductor 19 as the contact bump 24. As a result, the fingers 21 including the stainless steel lamination 22 spring member and the contact bumps 24 are formed by the kerf cut or slot 26 made by the dicing saw.

In the embodiment of FIG. 5, the kerfs are about one half of one thousandth of an inch wide when a dicing saw blade of half a thousandth thickness is used and the fingers are 2.8 thousands of an inch wide. The kerfs 26 are cut a tenth of an inch deep. As a result each side of the opening is about 500 thousandths of an inch in dimension accommodating a total of 600 coplanar contact bumps 24 on the ends of fingers 21 for registration with a similarly dimensioned 600 contact pad test pattern on an integrated circuit to be tested.

It should be noted that the test probe ring of the present invention is manufactured by forming a laminated assembly of a conductive structural member and an insulating (non-conducting) layer wherein the laminated assembly has a centrally disposed opening 18 therein. The stainless steel layer 22 is bonded to the insulating layer 23 by a dry film adhesive in this embodiment, such as DuPont Pyrolux (TM). A plurality of separate radially disposed conductors is formed on the accessible side of the insulating layer extending to the periphery of the opening 18. A durable non-oxidizing conductor wire is attached across the inner ends of the plurality of conductors 19 and a kerf is cut between the inner ends of each conductor and the adjacent conductor around the periphery of the opening 18. The conductors are thereby electrically separated into adjacent spring loaded fingers 21 having a durable substantially non-oxidizing contact bump 24 at the free ends of the fingers in a coplanar pattern which registers with a test pad pattern on an integrated circuit device. The outer ends of the conductors 19 are terminated in a connector means such as terminal 17 or, alternatively, a suitable connector. The kerfs are cut with a semiconductor dicing saw. The conductors 19 may be laid on the accessible side of the insulating layer 22 by any suitable means such as photo etching or the like. The thickness of the insulating layer and the thickness and width of the conductor strips 19 are selected to obtain a predetermined substantially uniform conductor impedance for the conductors on the probe test card. Typical conductor impedance values as seen by the tester 11 in the system of FIG. 1 are in the range of 50 to 100 ohms in the preferred embodiment of this invention at signal frequencies up to 90 GHz. The lamination layer dimensions disclosed herein provide the foregoing characteristics.

With reference again to FIGS. 3 and 5 of the drawings, an alternative method of manufacturing the invention disclosed herein involves assembling the first structural layer 22, which provides strength and ultimately spring action for the fingers 21, and the layer of copper conductor using a releasable adhesive. On the contact or copper conductor side of the two layers of metallic elements a length of P7 wire is attached at the periphery of the opening 18. The layered metallic elements are registered in position and the slots or kerfs 26 are cut with an electro discharge machine (wire EDM) using a cutting wire about one thousandths of an inch in diameter. The wider slots require opening 18 to be about 575 thousandths on a side Following the cutting of the kerfs 26, the slotted metallic laminates are separated. The bumps 24 are formed by the slots. The insulating layer 23 is placed between the two metallic layers and the two metallic layers are re-registered in position and the three layered assembly bonded together as seen in FIG. 4. A laser at low energy is directed at the three layered assembly to remove the Kapton insulation between the fingers 21 so each finger may flex separately. Alternatively sodium hydroxide or some similar chemical may be used to remove the Kapton webs between the fingers while leaving the metallic elements undisturbed. The conductors 19 are formed on the conductive copper side of the layered assembly by well known chemical etch steps so that the conductors extend from the contact bumps 24 at the periphery of the opening 18 to the connector means such as terminals 17 at the outer edge of the probe ring 14.

Alternatively, the cutting of the kerfs 26 may be performed by using a one thousandth of an inch thick tape in the EDM (tape EDM). The tape EDM has been found to cut straighter kerfs and also to have fewer cutting element failures than the wire EDM, because the tape, having more material therein, is a stronger cutting member.

The relationship for impedance utilized in the disclosed embodiment is $$Z_o = \frac{H \times 377}{W \times E_R}$$

where $Z_o$ is impedance, H is the dielectric layer 23 thickness, W is the conductor width and and ER is the dielectric constant of the insulating layer 23 (3.77 for Kapton used in this embodiment). This relationship is a simplification of the complete relationship found in Handbook of Electronic Packaging, HarperMcGraw Hill copyright 1969. The simplified relationship has been found to be appropriate empirically.

From the foregoing relationship it is apparent that in the configuration of the conductors and the laminated fingers and test probe ring disclosed herein, certain terms of the complete relationship for $Z_o$ may be ignored as insignificant. It may be seen that by proper arrangement of the dimensions of the conductors 19 and the dielectric layer in the laminated test probe ring that the desirable impedance characteristics of the test probe ring recited herein may be obtained.

Another embodiment of the disclosed invention involves forming two conductors 19 running the length of each of the fingers 21 and extending to separate terminals 17 or similar connectors. In this embodiment the dicing saw is used again after cutting the kerfs 26 to cut the bumps 24 in two parts as seen in FIG. 6 so that the two conductors 19 on each finger 21 are electrically separate and each have a bump 24 at their ends. The presence of two contact bumps on each finger provides the opportunity to invoke the principle of Kelvin contacts in testing semiconductor wafers to thereby reduce testing errors.

Although the best mode contemplated for carrying out the present invention has been herein shown and described, it will be understood that modification and variation may be made without departing from what is regarded to be the subject matter of the invention.

What is claimed is:

1. A semiconductor test probe ring for use in contacting a test pad pattern on a semiconductor device to be tested, comprising
   an insulation layer having a predetermined thickness and enclosing an opening therein,
   a plurality of electrically separate conductors attached to said insulation layer on a conductor side of the probe ring, said conductors each having outer ends and having inner ends terminating at the periphery of said opening,
   an electrically conductive ground plane member attached to said insulation layer on the side opposed to the conductor side for providing mechanical support for said insulation layer and said plurality of conductors, said ground plane having a ground plane opening aligned with said insulation layer opening,
   a plurality of layered fingers comprising insulation, conductor inner end and ground plane layers, said fingers having free ends extending to the edge of said aligned insulation layer and ground plane openings,
   said insulation, conductor inner end and ground plane layers on said layered fingers being attached to said insulation layer, ones of said electrically separate conductors and said electrically conductive ground plane member respectively,
   connector means for terminating the outer ends of said conductors, and
   a cylindrical contact having a cylindrical peripheral surface and a cylindrical axis, said cylindrical contact being attached to the free end of each of said plurality of conductors along a portion of said cylindrical peripheral surface parallel to said cylindrical axis, whereby said cylindrical contacts form a substantially co-planar contact pattern in registration with the test pad pattern, and whereby said plurality of conductors have substantially uniform predetermined impedance at high test signal frequency.

2. A semiconductor test probe ring as in claim 1 wherein said insulation layer thickness is substantially twice said conductor width.

3. A semiconductor test probe ring as in claim 1 wherein said cylindrical contact comprises a substantially non-oxidizing material.

4. A semiconductor test probe ring as in claim 1 wherein said ground plane member comprises spring members in each of said layered fingers, whereby said cylindrical contacts remain substantially co-planar throughout a plurality of contacts with test pad patterns.

5. A semiconductor test probe ring as in claim 1 wherein said conductors comprise conductor strips, and wherein said finger conductor strips are substantially twice as wide as they are thick.

6. A semiconductor test probe ring as in claim 5 wherein said insulation layer predetermined thickness is substantially two times said finger conductor strip width.

7. A semiconductor test probe ring as in claim 5 wherein said conductor strips comprise etched strips formed from a conductor plate attached to said conductor side of the probe ring.

8. A semiconductor test probe ring as in claim 1 wherein said fingers have two separate ones of said conductors thereon and wherein said cylindrical contact comprises two cylindrical contacts, one on each of said two separate ones of said conductors.

9. A test probe ring for semiconductor devices having a predetermined pattern of test pads connected thereto, comprising
a first layer of structural support material on a support side of the test probe ring providing an electrical ground plane,
a second layer of insulating material attached to said first layer,
a third layer of electrically separate conductors attached to said second layer on a contact side of the test probe ring,
said first, second and third layers having aligned openings therethrough,
a plurality of layered fingers extending to the edge of said aligned openings and having ground plane, insulation and separate conductor layers connected to said first, second and third layers respectively, and
a cylindrical contact having a cylindrical peripheral surface and a cylindrical axis, said cylindrical contact being attached to the free end of each of said finger separate conductor layers along a portion of said cylindrical peripheral surface parallel to said cylindrical axis to thereby form a pattern of contact bumps substantially in registration with the predetermined pattern of test pads,
said second and third layer thicknesses providing a predetermined separate conductor impedance at high frequency in view of interconductor capacitance, inductance and resistance.

10. A test probe ring as in claim 9 comprising connection means connected to the ends of said separate conductors at the ends thereof opposite said cylindrical contact attachments.

11. A test probe ring as in claim 9 wherein said separate conductors comprise conductor strips substantially twice as wide as they are thick and wherein said second layer is substantially four times as thick as said conductors.

12. A test probe ring as in claim 9 wherein said cylindrical contact comprises a substantially non-oxidizing material.

13. A test probe as in claim 9 wherein said cylindrical contact comprises a length of conductor wire.

14. A test probe as in claim 9 wherein said ground plane layer in each of said plurality of fingers comprises spring members, so that said cylindrical contacts remain co-planar throughout a plurality of contacts between said cylindrical contacts and the pattern of test pads.

15. A test probe as in claim 9 wherein said electrically separate conductors comprise conducting strips formed on said second layer surface.

16. A test probe as in claim 9 wherein said predetermined conductor impedance is in the range 50 to 100 ohms at frequencies in the gegahertz range.

17. A test probe as in claim 9 wherein said plurality of layered fingers comprise two electrically separate conductors thereon and wherein said cylindrical contact comprises one cylindrical contact attached to the end of each of said two conductors on each finger.

* * * * *